(12) United States Patent
Wong et al.

(10) Patent No.: US 8,415,779 B2
(45) Date of Patent: Apr. 9, 2013

(54) LEAD FRAME FOR SEMICONDUCTOR PACKAGE

(75) Inventors: Tzu Ling Wong, Kuala Lumpur (MY); Chee Seng Foong, Sungei Buloh (MY); Kai Yun Yow, Petaling Jaya (MY)

(73) Assignee: Freescale Semiconductor, Inc., Austin, TX (US)

( * ) Notice: Subject to any disclaimer, the term of this patent is extended or adjusted under 35 U.S.C. 154(b) by 163 days.

(21) Appl. No.: 13/047,803

(22) Filed: Mar. 15, 2011

(65) Prior Publication Data

US 2011/0248390 A1 Oct. 13, 2011

(30) Foreign Application Priority Data

Apr. 13, 2010 (MY) .......................... PI 2010001643

(51) Int. Cl.
*H01L 23/495* (2006.01)

(52) U.S. Cl.
USPC ........... 257/673; 257/676; 257/778; 257/666; 257/E23.039

(58) Field of Classification Search .................. 257/673, 257/676, E23.039
See application file for complete search history.

(56) References Cited

U.S. PATENT DOCUMENTS

| 5,239,198 | A | | 8/1993 | Lin | |
|---|---|---|---|---|---|
| 5,731,631 | A | * | 3/1998 | Yama et al. .................... | 257/702 |
| 6,388,336 | B1 | * | 5/2002 | Venkateshwaran et al. .. | 257/779 |
| 6,396,129 | B1 | | 5/2002 | Hung | |
| 7,375,416 | B2 | | 5/2008 | Retuta | |
| 7,635,910 | B2 | * | 12/2009 | Sinaga et al. ................. | 257/673 |
| 2006/0125113 | A1 | * | 6/2006 | Liu et al. ....................... | 257/778 |
| 2006/0170081 | A1 | * | 8/2006 | Gerber et al. ................. | 257/666 |
| 2008/0258274 | A1 | * | 10/2008 | Sinaga et al. ................. | 257/673 |
| 2009/0045491 | A1 | * | 2/2009 | Kim ............................... | 257/673 |

* cited by examiner

*Primary Examiner* — Nitin Parekh
(74) *Attorney, Agent, or Firm* — Charles Bergere

(57) ABSTRACT

A lead frame for providing electrical interconnection to an Integrated Circuit (IC) die. The lead frame includes a die support area for receiving and supporting the IC die and a plurality of leads surrounding the die support area. A plurality of interconnect receiving portions is formed in the die support area. The interconnect receiving portions are for providing electrical interconnection to first bumps on a bottom surface of the IC die. The leads are for providing electrical interconnection to second bumps on a surface of the IC die, the second bumps surrounding the first bumps.

18 Claims, 4 Drawing Sheets

LEAD FRAME FOR SEMICONDUCTOR PACKAGE

BACKGROUND OF THE INVENTION

The present invention relates to the packaging of integrated circuits (ICs) and more particularly to lead frames for semiconductor packages.

Conventional Quad Flat Packages (QFP) and Quad Flat No Lead (QFN) packages typically include an integrated circuit (IC) die electrically connected to a lead frame. In the case of a QFP package, leads extending from sides of the QFP package provide electrical interconnection to external devices such as, for example, a printed circuit board (PCB). In the case of a QFN package, perimeter lands on a bottom surface of such packages provide electrical connections to external devices.

With technological advances, it is desirable to increase the input/output (IO) capabilities of lead frame based packages.

BRIEF DESCRIPTION OF THE DRAWINGS

The following detailed description of a preferred embodiment of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

DETAILED DESCRIPTION OF THE INVENTION

Figure 1:
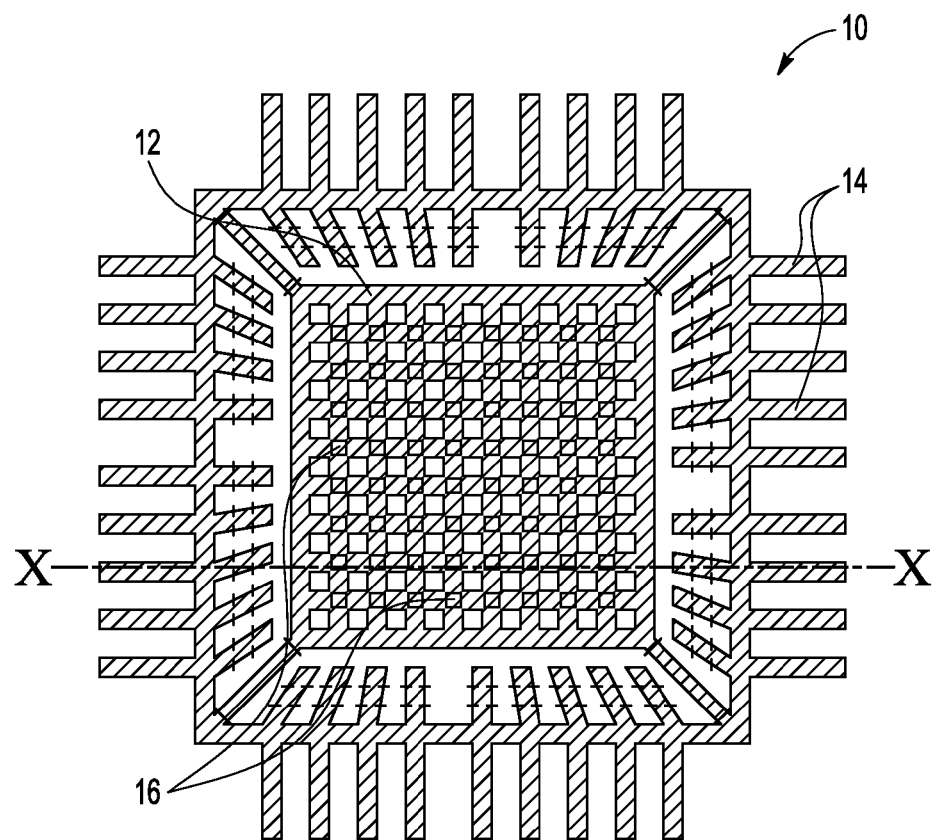
FIG. 1 is a schematic top plan view of a lead frame in accordance with an embodiment of the present invention.

The detailed description set forth below in connection with the appended drawings is intended as a description of a presently preferred embodiment of the invention, and is not intended to represent the only form in which the present invention may be practiced. It is to be understood that the same or equivalent functions may be accomplished by different embodiments that are intended to be encompassed within the scope of the invention. In the drawings, like numerals are used to indicate like elements throughout.

The present invention provides a lead frame for providing electrical interconnection to an Integrated Circuit (IC) die. The lead frame includes a die support area for receiving and supporting the IC die and a plurality of leads surrounding the die support area. A plurality of interconnect receiving portions is formed in the die support area. The interconnect receiving portions are for providing electrical interconnection to first bumps on a bottom surface of the IC die. The leads are for providing electrical interconnection to second bumps on a surface of the IC die, the second bumps surrounding the first bumps.

The present invention further provides a lead frame including a die support area and a plurality of leads surrounding the die support area. An outer lead portion of the leads is formed in a first plane and an inner lead portion of the leads is formed in a second plane that is down-set from the first plane such that a die alignment feature is defined in the leads. A plurality of interconnect receiving portions is formed in the die support area. The interconnect receiving portions are arranged to receive a plurality of flip chip bumps of a flip chip die.

The present invention further provides a semiconductor package including a lead frame having a die support area, a plurality of interconnect receiving portions formed in the die support area, and a plurality of leads surrounding the die support area. An integrated circuit (IC) die is attached to the die support area of the lead frame and is electrically connected to the interconnect receiving portions. A molding compound encapsulates the IC die and a portion of the lead frame.

Referring now to FIG. 1, a schematic top plan view of a lead frame 10 is shown. The lead frame 10 includes a die support area 12 and a plurality of leads 14 surrounding the die support area 12. A plurality of interconnect receiving portions 16 is formed in the die support area 12.

In one embodiment, the lead frame 10 is formed from a copper sheet or strip having a thickness of between about 200 microns (μm) and about 500 μm. However, it should be understood that the present invention is not limited by the material or thickness of the material used. The lead frame 10 may be formed of a different metal or metal alloy with a different thickness in alternative embodiments. Further, the metal may be bare or plated, as is known in the art. The lead frame 10 may be formed via cutting, etching, stamping or other known lead frame manufacturing processes.

The interconnect receiving portions 16 are arranged to receive a plurality of flip chip bumps of a flip chip die (see, for example, flip chip bumps 34 of flip chip die 32 in FIG. 3 described below). Advantageously, the provision of interconnect receiving portions 16 in the die support area 12 of the lead frame 10 optimizes the use of the space on the die support area 12 and increases the input/output (IO) capabilities of lead frame based packages formed with such lead frames 10.

In the embodiment shown, the interconnect receiving portions 16 are formed in a matrix arrangement in a central portion of the die support area 12. Advantageously, such an arrangement of the interconnect receiving portions 16 fully utilizes the space available at the center portion of the lead frame 10.

Figure 2:
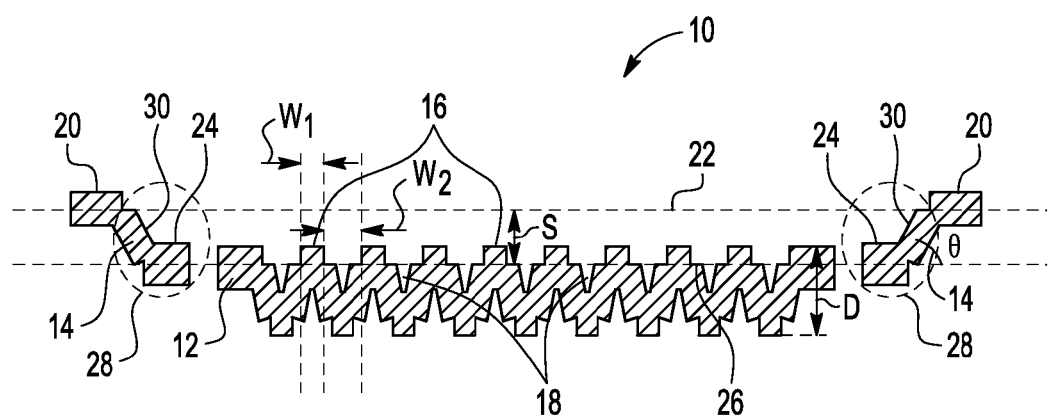
FIG. 2 is an enlarged cross-sectional view of the lead frame of FIG. 1 along a line X-X.

Referring now to FIG. 2, an enlarged cross-sectional view of the lead frame 10 along a line X-X in FIG. 1 is shown. As can be seen from FIG. 2, a plurality of dimples 18 is formed adjacent respective ones of the interconnect receiving portions 16. As shown also in FIG. 2, an outer lead portion 20 of the leads 14 is formed in a first plane 22 and an inner lead portion 24 of the leads 14 is formed in a second plane 26 that is down-set from the first plane 22 such that a die alignment feature 28 is defined in the leads 14. The die alignment feature 28 includes a sloping section 30 extending between the outer and inner lead portions 20 and 24 of the leads 14.

In one embodiment, the interconnect receiving portions 16 are formed to a width $W_1$ of between about 250 μm and about 500 μm. However, it should be understood that the present invention is not limited by the width of the interconnect receiving portions 16. The width of the interconnect receiving portions 16 may be wider or narrower depending, for example, on the diameter of the flip chip bumps that are to be accommodated. The interconnect receiving portions 16 may be formed by stamping or other known lead frame manufacturing processes, such as etching, or buildup methods like plating.

The dimples 18 allow the interconnect receiving portions 16 to be electrically isolated from each other when a bottom surface of the electrical interconnect portions 16 is removed. In one embodiment, the dimples 18 are formed to a depth D of between about 300 µm and about 500 µm and a width $W_2$ of between about 300 µm and about 500 µm. However, it should be understood that the present invention is not limited by the depth and width of the dimples 18. The depth of the dimples 18 may be shallower or deeper and the width of the dimples 18 may be wider or narrower depending, for example, on the separation required between adjacent ones of the interconnect receiving portions 16. The dimples 18 may be formed by stamping or other known lead frame manufacturing processes, such as etching.

In one embodiment, the second plane 26 in which the inner lead portion 24 of the leads 14 lies is down-set from the first plane 22 in which the outer lead portion 20 of the leads 14 lies by a separation S of between about 200 µm and about 400 µm. However, it should be understood that the present invention is not limited by the separation between the first and second planes 22 and 26. The separation between the first and second planes 22 and 26 may be wider or narrower depending, for example, on the height of the flip chip bumps that are to be received on the interconnect receiving portions 16.

Advantageously, the die alignment feature 28 facilitates self alignment of a die during a die attach reflow process as the sloping section 30 helps to prevent flip chip bumps of the die from slipping sideways during the die attach reflow process. This reduces yield loss due to die misalignment during the die attach reflow process. For example, in a typical flip chip die attach process, occasionally (low ppm (parts per million) level occurrence) the dies become offset during the die attach process or reflowing process. With the die alignment feature 28 accorded by the perimeter leads, all the dies will automatically slip into the correct final position due to the sloping section 30 of the leads. Essentially the leads act as retaining walls and guide and center the dies into position. In one embodiment, the sloping section 30 is formed at an angle θ of between about 30° and about 45° measured anticlockwise from the second plane 26. However, it should be understood that the present invention is not limited by the angle of incline of the sloping section 30. This may be greater or smaller depending, for example, on the separation distance between the first and second planes 22 and 26.

Figure 3:
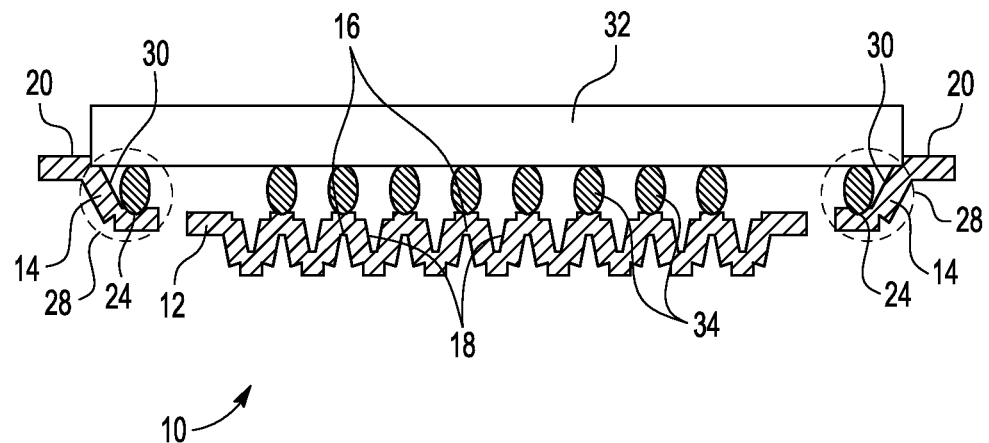
FIG. 3 is an enlarged cross-sectional view of an integrated circuit (IC) die attached and electrically connected to the lead frame of FIG. 2.

Referring now to FIG. 3, an integrated circuit (IC) die 32 is attached and electrically connected to the lead frame 10 as shown. The IC die 32 is attached to the die support area 12 of the lead frame 10 and is electrically connected to the interconnect receiving portions 16.

The IC die 32 may be any type of circuit such as, for example, a digital signal processor (DSP) or a special function circuit. The IC die 32 is not limited to a particular technology such as CMOS, or derived from any particular wafer technology. Further, the present invention can accommodate IC dice of various sizes; for example, in one embodiment, the IC die 32 may be about 6 mm by about 6 mm in size.

In the embodiment shown, the IC die 32 is a flip chip die having a plurality of controlled collapse chip connection (C4) bumps 34 that are individually received on the interconnect receiving portions 16 and by the die alignment feature 28.

The provision of interconnect receiving portions 16 in the die support area 12 of the lead frame 10 optimizes the use of the space on the die support area 12 and increases the input/output (IO) count of the resulting package.

A reflow process is performed on the bumps 34 to form C4 type interconnections between the interconnect receiving portions 16 and the flip chip die 32. The reflow process is performed on the bumps 34 by passing the flip chip die 32 and the lead frame 10 through a reflow oven. For example, the lead frame 10 may be placed on a conveyor belt that passes through a reflow oven. The reflow process may be performed using known methods of reflow attachment such as, for example, Infrared Radiation (IR) Reflow, Vapour Phase Reflow and Hot Air Convection Reflow. The heat in the reflow oven melts the bumps 34. The melted bumps 34 wet the interconnect receiving portions 16 and form C4 type interconnections between the interconnect receiving portions 16 and the flip chip die 32 on cooling.

Figure 4:
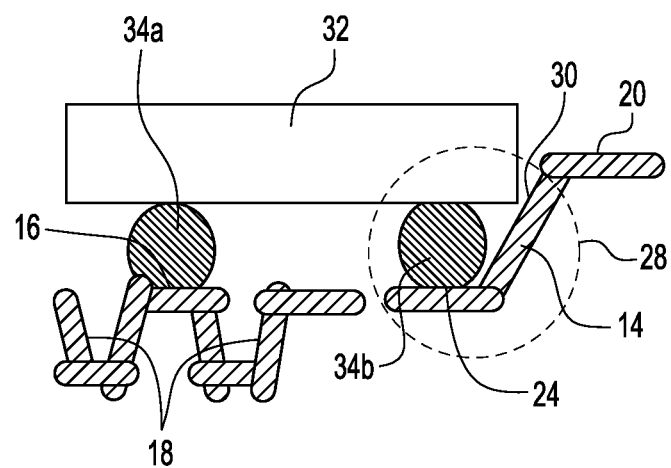
FIG. 4 is an enlarged view of a portion of the lead frame and the IC die of FIG. 3.

Referring now to FIG. 4, an enlarged view of a portion of the lead frame 10 and the flip chip die 32 of FIG. 3 is shown. As can be seen from FIG. 4, the interconnect receiving portion 16 provides electrical interconnection to a first bump 34a on a bottom surface of the IC die 32 and the lead 14 provides electrical interconnection to a second bump 34b on a surface of the IC die 32.

The die alignment feature 28 facilitates self alignment of the flip chip die 32 during the die attach reflow process as the sloping section 30 helps to prevent flip chip bumps 34 of the flip chip die 32 from slipping sideways. This reduces yield loss due to die misalignment during the die attach reflow process.

Figure 5:
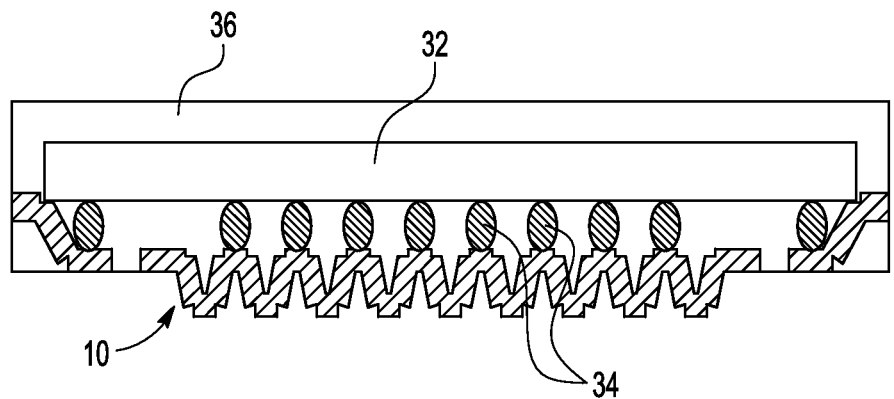
FIG. 5 is an enlarged cross-sectional view of a molding compound encapsulating the IC die, flip chip bumps and a portion of the lead frame of FIG. 4.

Referring now to FIG. 5, a molding compound 36 encapsulates the flip chip die 32, the flip chip bumps 34 and a portion of the lead frame 10. A well known encapsulation process such as, for example, injection molding, may be performed to encapsulate the flip chip die 32, the flip chip bumps 34 and the lead frame 10. The molding compound 36 may comprise a well known commercially available molding material such as plastic or epoxy.

Figure 6:
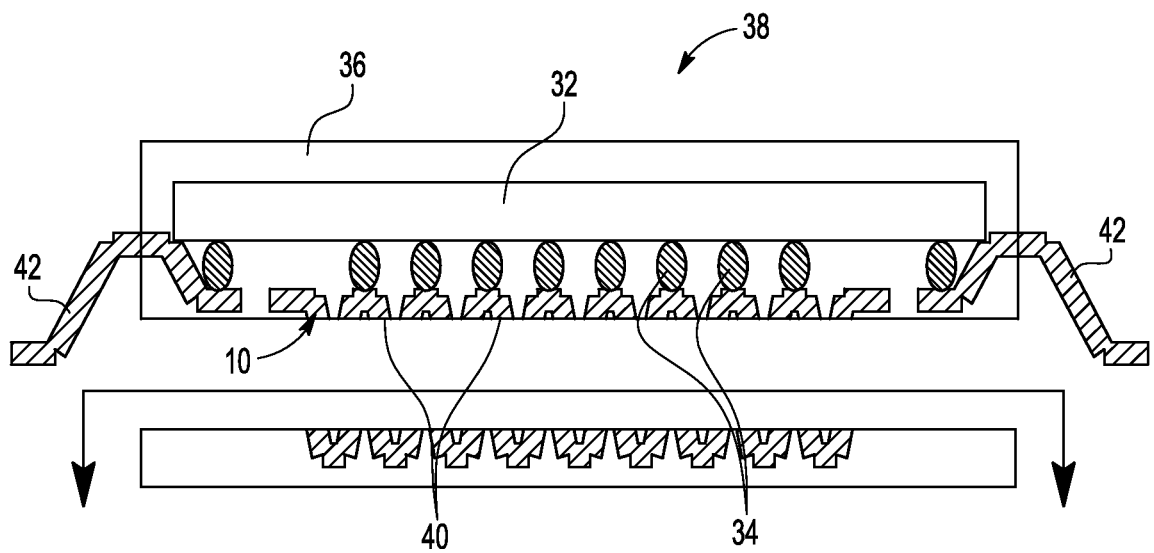
FIG. 6 is an enlarged cross-sectional view of a the encapsulated IC die, flip chip bumps and lead frame of FIG. 5 with a bottom portion being removed, in accordance with an embodiment of the present invention.

Referring now to FIG. 6, an enlarged cross-sectional view of a semiconductor package 38 in accordance with an embodiment of the present invention is shown. A plurality of input/output (IO) terminals 40 are formed on a surface of the semiconductor package 38 and a plurality of external leads 42 extend from a plurality of sides of the semiconductor package 38.

A cutting or grinding operation is performed after the encapsulation process to electrically isolate the IO terminals 40 from each other. If by grinding, the grinding operation may be performed by a series of rotary grinders similar to those used for wafer back-grinding. A trim and form operation also may be performed on the external leads 42. The trim and form operation entails punching out the dam bars, pre-forming the leads together with tab cut, full forming of the leads to the desired shape, and final length cut on the leads. The individual packages are then separated from the lead frame runner. Such operations are well known to those of ordinary skill in the art. Therefore, skilled artisans do not require more detailed descriptions of these processes for a complete understanding of the present invention.

Figure 7:
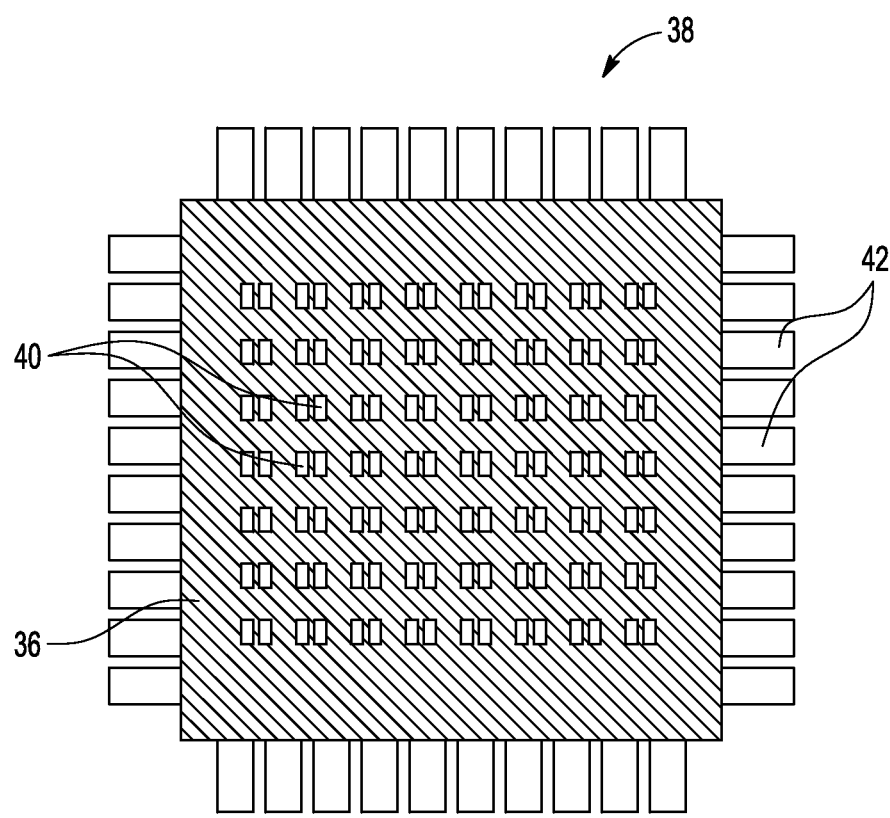
FIG. 7 is a bottom plan view of the semiconductor package of FIG. 6.

Referring now to FIG. 7, a bottom plan view of the semiconductor package 38 is shown. As shown in FIG. 7, the IO terminals 40 are formed on a bottom surface of the semiconductor package 38 and the external leads 42 extend from each of the sides of the semiconductor package 38.

Advantageously, both the IO terminals 40 and the external leads 42 can be used to provide electrical connections to external devices such as, for example, a printed circuit board (PCB). This increases the input/output (IO) capabilities of the semiconductor package 38 over conventional lead frame based semiconductor packages.

As is evident from the foregoing discussion, the present invention provides a lead frame and a semiconductor package with improved input/output (IO) capabilities. The provision of interconnect receiving portions in the die support area of the lead frame optimizes the use of the space on the die support area and increases the input/output (IO) capabilities of the lead frame and semiconductor packages formed with such lead frames. Further advantageously, the provision of the die alignment feature in the lead frame facilitates self alignment of a die during a die attach reflow process as the sloping section helps to prevent the die from slipping sideways during the die attach reflow process. This reduces yield loss due to die misalignment during the die attach reflow process.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the scope of the present invention as defined by the appended claims.

The invention claimed is:

1. A lead frame for providing electrical interconnection to an Integrated Circuit (IC) die, the lead frame comprising:
    a die support area for receiving and supporting the IC die;
    a plurality of interconnect receiving portions formed in the die support area, the interconnect receiving portions for providing electrical interconnection to first bumps on a bottom surface of the IC die; and
    a plurality of leads surrounding the die support area, the leads for providing electrical interconnection to second bumps on a surface of the IC die, wherein the second bumps surround the first bumps,
    wherein an outer lead portion of the leads is formed in a first plane and an inner lead portion of the leads is formed in a second plane that is down-set from the first plane such that a die alignment feature is defined in the leads.

2. The lead frame of claim 1, wherein a plurality of dimples is formed adjacent respective ones of the interconnect receiving portions.

3. The lead frame of claim 2, wherein the dimples are formed by stamping.

4. The lead frame of claim 2, wherein the dimples allow the interconnect receiving portions to be electrically isolated from each other when a bottom surface of the interconnect receiving portions is removed, wherein the removed portions extend in a vertical direction from a bottom surface of the die receiving area to a bottom surface of the dimples.

5. The lead frame of claim 1, wherein the interconnect receiving portions are formed in a matrix arrangement in the die support area.

6. The lead frame of claim 1, wherein the interconnect receiving portions are formed in a central portion of the die support area.

7. A lead frame, comprising:
    a die support area;
    a plurality of interconnect receiving portions formed in the die support area, wherein the interconnect receiving portions are arranged to receive a plurality of flip chip bumps of a flip chip die; and
    a plurality of leads surrounding the die support area, wherein an outer lead portion of the leads is formed in a first plane and an inner lead portion of the leads is formed in a second plane that is down-set from the first plane such that a die alignment feature is defined in the leads.

8. The lead frame of claim 7, wherein a plurality of dimples is formed adjacent respective ones of the interconnect receiving portions.

9. The lead frame of claim 8, wherein the dimples are formed by stamping or etching.

10. The lead frame of claim 7, wherein the interconnect receiving portions are formed in a matrix arrangement in the die support area.

11. The lead frame of claim 7, wherein the interconnect receiving portions are formed in a central portion of the die support area.

12. A semiconductor package, comprising:
    a lead frame having a die support area, a plurality of interconnect receiving portions formed in the die support area, and a plurality of leads surrounding the die support area, wherein an outer lead portion of the leads is formed in a first plane and an inner lead portion of the leads is formed in a second plane that is down-set from the first plane such that a die alignment feature is defined in the leads;
    an integrated circuit (IC) die attached to the die support area of the lead frame and electrically connected to the interconnect receiving portions; and
    a molding compound encapsulating the IC die and a portion of the lead frame.

13. The semiconductor package of claim 12, further comprising a plurality of input/output (IO) terminals formed on a surface of the semiconductor package and a plurality of external leads extending from a plurality of sides of the semiconductor package.

14. The semiconductor package of claim 12, wherein a plurality of dimples is formed adjacent respective ones of the interconnect receiving portions.

15. The semiconductor package of claim 12, wherein the interconnect receiving portions are formed in a matrix arrangement in the die support area of the lead frame.

16. The semiconductor package of claim 12, wherein the IC die is a flip chip die.

17. The semiconductor package of claim 16, wherein the interconnect receiving portions are arranged to receive a plurality of flip chip bumps on the flip chip die.

18. The semiconductor package of claim 12, wherein the interconnect receiving portions are formed in a central portion of the die support area of the lead frame.

* * * * *